United States Patent [19]

Fujita et al.

[11] Patent Number: 4,539,551
[45] Date of Patent: Sep. 3, 1985

[54] DIFFERENTIAL VOLTAGE AMPLIFIER

[75] Inventors: Yasuhiko Fujita, Tokyo; Eiji Masuda, Kawasaki, both of Japan

[73] Assignee: Tokyo Shibaura Denki Kabushiki Kaisha, Japan

[21] Appl. No.: 518,443

[22] Filed: Jul. 29, 1983

[30] Foreign Application Priority Data

Jul. 30, 1982 [JP] Japan .............................. 57-133560
Dec. 7, 1982 [JP] Japan .............................. 57-214335

[51] Int. Cl.³ ...................... H03K 13/02; H03K 3/023
[52] U.S. Cl. ................................. 340/347 AD; 330/9; 307/362
[58] Field of Search ................. 340/347 AD, 347 CC; 330/9, 51, 69; 307/359, 360, 362, 491, 494, 497, 498

[56] References Cited

U.S. PATENT DOCUMENTS

| | | | |
|---|---|---|---|
| 3,676,702 | 7/1972 | McGrogan, Jr. | 307/235 |
| 3,818,246 | 6/1974 | Hellwarth et al. | 330/9 |
| 4,152,659 | 5/1979 | Gordon | 330/9 |
| 4,190,805 | 2/1980 | Bingham | 330/9 |
| 4,237,390 | 12/1980 | Buurma | 307/362 |
| 4,253,033 | 2/1981 | Redfern | 307/205 |
| 4,276,513 | 6/1981 | Johnston et al. | 330/9 |
| 4,450,368 | 5/1984 | Spence | 307/362 |

FOREIGN PATENT DOCUMENTS 2825882 6/1979 Fed. Rep. of Germany .
2855584 8/1979 Fed. Rep. of Germany .

OTHER PUBLICATIONS

Electronics, May 5, 1982, p. 138, FIG. 1.
Allstot, "A Precision Variable-Supply CMOS Comparator," IEEE Journal of Solid-State Circuits, vol. SC-17, No. 6, Dec. 1982.
Dingwall, "Monolithic Expandable 6 Bit 20 MHz CMOS/SOS A/D Converter," IEEE J. Solid-State Circuits, vol. SC-14, No. 6, pp. 926-932, Dec. 1979.

Primary Examiner—Vit W. Miska
Attorney, Agent, or Firm—Finnegan, Henderson, Farabow, Garrett & Dunner

[57] ABSTRACT

A differential voltage amplifier comprises a first and second capacitive coupling type amplifiers in each of which an autozeroed mode period for setting an operating point and a signal amplifying mode period for amplifying an input voltage are alternately set up, and the autozeroed mode periods in said first and second amplifier are shifted from each other, first and second mode selector for alternately setting up the autozeroed mode and the signal amplifying mode in the first and second capacitive coupling type amplifiers, first and second signal selectors provided corresponding to the first and second capacitive coupling type amplifiers, the first and second signal selectors alternately selecting a reference voltage and an input signal voltage to apply the selected signal to the first and second capacitive coupling type amplifiers, the first and second signal selectors further selecting the reference voltage corresponding to the autozeroed mode periods of the first and second capacitive coupling type amplifiers and the input signal voltage corresponding to the signal amplifying mode periods, and a selector for selecting the amplified signal output from the first and second capacitive coupling type amplifiers when the first and second capacitive coupling type amplifiers are in the signal amplifying mode.

8 Claims, 29 Drawing Figures

FIG. 3A
FIG. 3B
FIG. 3C
FIG. 3D
FIG. 4
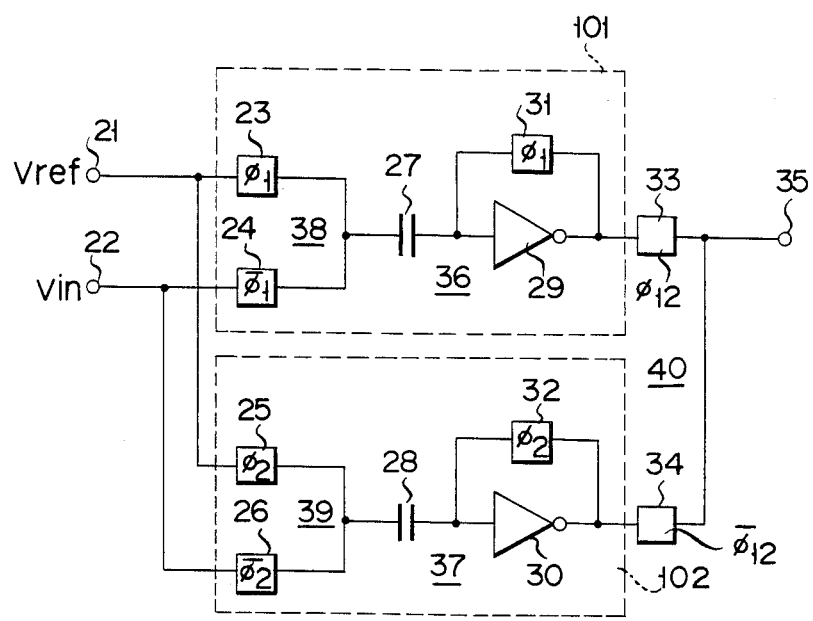

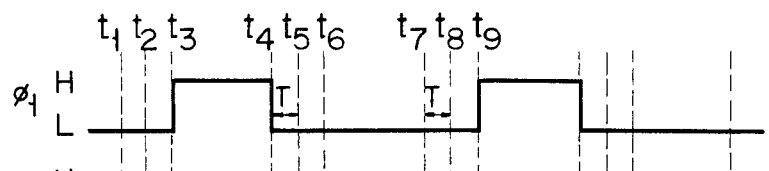
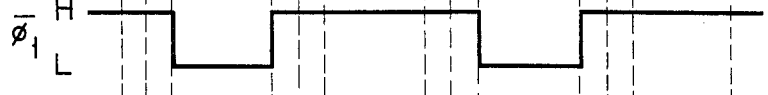
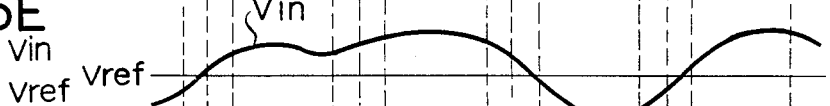
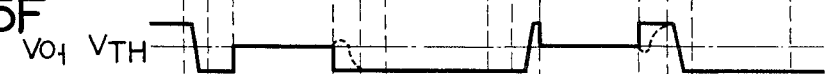
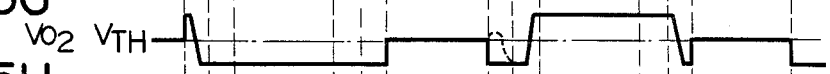
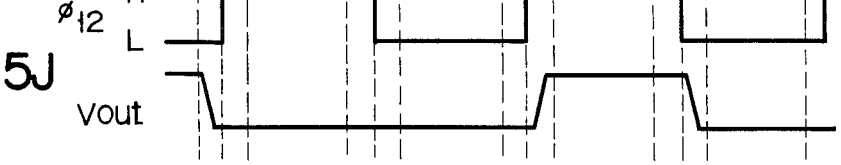

DIFFERENTIAL VOLTAGE AMPLIFIER

BACKGROUND OF THE INVENTION

This invention relates to a difference voltage amplifier circuit for amplifying a differential voltage between an input signal voltage and a reference voltage.

By convention, a general parallel A/D (analog to digital) converter is provided with a plurality of differential amplifiers each composed of a bipolar transistor. This type of parallel A/D converter will be described referring to FIG. 1. In FIG. 1, reference numeral 1 designates a voltage divider composed of resistors. Positive and negative reference voltages +Vref and −Vref are applied to the terminals of the voltage divider 1. The divided voltages derived from the interconnection points of the resistors connected in series are input, as reference voltages $Vref_1$–$Vref_n$, to the input terminals of the differential amplifiers $2_1$–$2_n$ composed of bipolar transistors, those input terminals each being one of the input terminals of each of the differential amplifiers $2_1$–$2_n$. An input signal voltage Vin is applied to the other input terminals of the differential amplifiers $2_1$–$2_n$, where the input signal voltage Vin is compared with the reference voltages $Vref_1$–$Vref_n$. The differential amplifiers $2_1$–$2_n$ respectively amplify differences between the input signal voltage Vin and the reference voltages $Vref_1$–$Vref_n$. The output signal voltages $Vo_1$–$Vo_n$ are input to an encoder 3 where these are encoded. Then, the encoded signal is applied through an output resister 4 to a buffer 5, which in turn produces digital signals D and $\overline{D}$.

In the example mentioned above, the differential amplifiers $2_1$–$2_n$ are composed of bipolar transistors, even several tens of MHz can be sampled, i.e., the circuit is operable at high speed.

With such an arrangement, the offset voltages of the differential amplifiers $2_1$–$2_n$ differ depending on the magnitudes of the reference voltages $Vref_1$, $Vref_2$, ..., $Vref_n$ to the differential amplifiers $2_1$–$2_n$. This fact implies that the circuit has a problem of linearity. Further, differential amplifiers using the bipolar transistors require great power dissipation.

Another known approach to solving such a problem is an A/D converter using the chopper type comparator, as shown in FIG. 2. In the chopper type comparator, the first input terminal 6 is applied with a reference voltage Vref (FIG. 3C). The second input terminal 7 is applied with an input signal voltage Vin (FIG. 3C) to be compared with the reference voltage Vref. The first and second input terminals 6 and 7 are connected to a first terminal or input electrode of a capacitor 10, through first and second switches 8 and 9. The first and second switches 8 and 9 are analog switches made of FETs (field effect transistors), for example. These switches are on-off controlled by a clock signal φ (FIG. 3A) and its inverted signal $\overline{\phi}$ (FIG. 3B). The reference voltage Vref and the input signal voltage Vin are applied to the first terminal of the capacitor 10, through the first and second switches 8 and 9. A second terminal or output electrode of the capacitor 10 is connected to the input terminal of an inverting amplifier 11 composed of a MOS transistor. A third switch 12 made up of an FET analog switch, for example, which is on-off controlled by the clock signal φ, is provided between the input and output terminals of the inverting amplifier 11. The output signal Vout (FIG. 3D) of the inverting amplifier 11 is taken out through an output terminal 13.

With such an arrangement, during the "H" level period of the clock signal φ (FIG. 3A), the first switch 8 and the third switch 12 are turned on, while the second switch 9 is turned off. Therefore, the input electrode of the capacitor 10 is applied with the reference voltage Vref (FIG. 3C). The input and output terminals of the inverting amplifier 11 are short-circuited so that the input voltage of the inverting amplifier 11 may be made a threshold voltage $V_{TH}$ of the inverting amplifier 11, i.e., an operating point voltage as a reference voltage for the circuit operation. During the "H" level period of the clock $\overline{\phi}$ (FIG. 3B), the first and third switches 8 and 12 are turned off, while the second switch 9 is turned on. Accordingly, the input electrode of the capacitor 10 is applied with the input signal voltage Vin.

Then, the input voltage, i.e., the threshold voltage $V_{TH}$, to the inverting amplifier 11 changes by a difference (Vin−Vref). A change of the input voltage is multiplied by an amplification factor of the inverting amplifier 11 and is taken out as a circuit output signal Vout (FIG. 3D) from the output terminal 13. As described above, in this comparator of FIG. 2, it is possible to obtain an output signal Vout (FIG. 3D) composed of a train of pulses in synchronism with the clock signal φ by setting the reference voltage Vref at a proper value with respect to the input signal voltage Vin (FIG. 3C). In this way, the above-mentioned circuit arrangement alternately repeats an autozeroed mode in which the circuit operating point is set up by shorting the input and the output of the inverting amplifier 11, and a signal amplifying mode for inputting to the inverting amplifier 11 a difference between the input signal voltage Vin and the reference voltage Vref and amplifying the same. Through this operation, an output signal voltage Vout shown in FIG. 3D is obtained.

The comparator as mentioned above has a low power dissipation since the inverting amplifier 11 is composed of the MOS transistor. However, since this chopper type of comparator operates as a sampling system, it will be understood from the sampling theory that the comparator fails to correctly sample the input signal voltage Vin when the frequency of the input signal voltage Vin is higher than ½ the frequency of the clock signal φ. To perform high speed sampling, the influence of both a stray capacitance and an ON resistance, becomes distinctive because the ON duration of the switch is short in the high speed sampling operation. The stray capacitance and the ON resistance cause a signal transfer delay, a gain loss, etc. Further, a stray capacitance, which appears between the signal input terminal and the signal output terminal, and the control terminal of the switch for receiving the clock φ, cause a feedthrough of clock pulses into the input signal to produce whiskerlike pulses at the level-changing of the clock pulse. This pulse signal renders the output signal unstable. Following this unstable state, a relatively long time is required until the circuit operation settles down to be stable. Because of this, the high speed circuit operation is damaged from a dynamic viewpoint of the circuit, and the output signal of the circuit is set off from a static viewpoint.

SUMMARY OF THE INVENTION

Accordingly, an object of the present invention is to provide a differential voltage amplifying circuit which can perform a successive comparison of a high frequency input signal voltage with a reference voltage and requires low power consumption and is free from the adverse influence from stray capacitance.

Another object of the present invention is to provide an integrated circuit for analog-to-digital conversion with such a differential voltage amplifying circuit incorporated thereinto.

According to the invention, there is provided a differential voltage amplifier comprising:

first and second capacitive coupling type amplifying means in each of which an autozeroed mode period for setting an operating point and a signal amplifying mode period for amplifying an input voltage are alternately set up, and the autozeroed mode periods in said first and second amplifying means are shifted from each other;

first and second mode select means for alternately setting up the autozeroed mode and the signal amplifying mode in said first and second capacitive coupling type amplifying means;

first and second signal selecting means provided corresponding to said first and second capacitive coupling type amplifying means, said first and second signal selecting means alternately selecting a reference voltage and an input signal voltage to apply the selected signal to said first and second capacitive coupling type amplifying means, said first and second signal selecting means further selecting the reference voltage corresponding to the autozeroed mode periods of said first and second capacitive coupling type amplifying means and the input signal voltage corresponding to the signal amplifying mode periods; and means for selecting the amplified signal output from said first and second capacitive coupling type amplifying means when said first and second capacitive coupling type amplifying means are in the signal amplifying mode.

According to the invention, there is further provided an integrated circuit for A/D conversion comprising:

a plurality of differential voltage amplifiers whose first input terminals are applied with an input signal voltage and whose second input terminals are applied with different reference voltages, each of said differential voltage amplifiers including;

first and second capacitive coupling type amplifying means each of which are alternately set in an autozeroed mode period for setting an operating point and a signal amplifying mode period for amplifying an input voltage, the periods of the autozeroed modes in said first and second amplifying means being shifted from each other;

first and second mode selecting means for alternately setting up the autozeroed mode and the signal amplifying mode in said first and second capacitive coupling type amplifying means;

first and second signal selecting means provided corresponding to said first and second capacitive coupling type amplifying means, said first and second signal selecting means alternately selecting a reference voltage and an input signal voltage to apply the selected signal to said first and second capacitive coupling type amplifying means, said first and second signal selecting means further selecting the reference voltage corresponding to the autozeroed mode periods of said first and second capacitive coupling type amplifying means and the input signal voltage corresponding to the signal amplifying mode periods; and means for selecting the amplified signal output from said first and second capacitive coupling type amplifying means when said first and second capacitive coupling type amplifying means are in the signal amplifying mode.

BRIEF DESCRIPTION OF THE DRAWINGS

FIGS. 3A to 3D show timing charts of signals at key portions in the comparator of FIG. 2;

FIG. 4 shows a circuit arrangement of an embodiment of a differential voltage amplifier circuit according to the present invention;

FIGS. 5A to 5J show timing charts of signals at key portions of the circuit of FIG. 4;

DETAILED DESCRIPTION OF THE PREFERRED EMBODIMENTS

Figure 1:
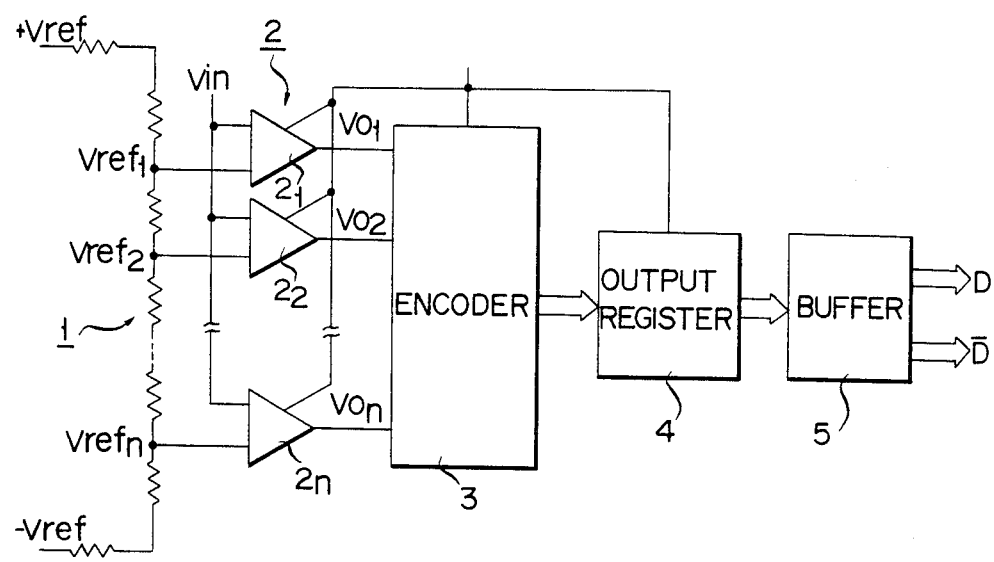
FIG. 1 is a circuit diagram of an example of a prior parallel A/D converter.
Figure 2:
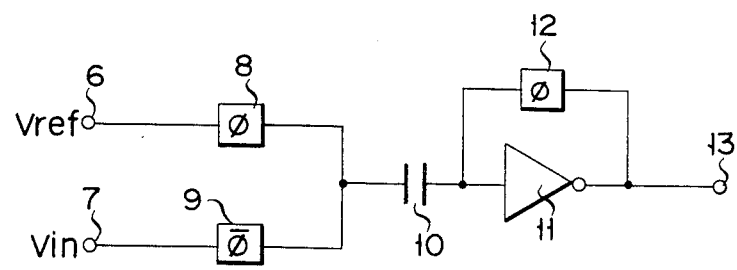
FIG. 2 is a circuit diagram of an example of a prior chopper type comparator.

Reference is made to FIG. 4 illustrating in block form an embodiment of a differential voltage amplifier according to this invention. The differential voltage amplifier is comprised of chopper type comparators 101 and 102, and seventh and eighth switches 33 and 34 for selecting the output signals from the chopper type comparators 101 and 102. The first chopper type comparator 101 includes a first switch 23, a second switch 24 and fifth switch 31, a first capacitor 27, and a first inverting amplifier 29. The second chopper type comparator 102 likewise includes a third switch 25, a fourth switch 26 and a sixth switch 32, a second capacitor 28, and a second inverting amplifier 30. Those switches 23 to 26 and 31 to 36 are FET analog switches, for example. Reference numeral 21 and 22 are first and second input terminals of a differential voltage amplifier to which the reference voltage Vref and the input signal voltage Vin are input. The first input terminal 21 is connected via the first switch 23 to the input electrode of the first capacitor 27 and via the third switch 25 to the input electrode of the second capacitor 28. The second input terminal 22 is connected via the second switch 24 to the input electrode of the first capacitor 27, and via the fourth switch 26 to the input electrode of the second capacitor 28. The output electrodes of the first capacitor 27 and the second capacitor 28 are respectively connected to the input terminals of the first inverting amplifier 29 and second inverting amplifier 30 made up of MOS transistors. The fifth switch 31 and sixth switch 32 are respectively inserted between the input and output terminals of the first inverting amplifier 29 and second inverting amplifier 30. The output terminals of the first inverting amplifier 29 and second inverting amplifier 30 are connected to the output terminal 35 through seventh and eighth switches 33 and 34.

The first capacitor 27 and the first inverting amplifier 29 make up a first capacitive coupling amplifier circuit 36. The second capacitor 28 and the second inverting amplifier 30 compose a second capacitive coupling amplifier circuit 37.

The fifth switch 31 serves as a first mode select means for alternately setting up an autozeroed mode to provide an operating point as a reference for the circuit operation and a signal amplifying mode for amplifying the input voltage. The sixth switch 32 serves as a second mode select means for alternately setting up an autozeroed mode to provide an operating point as a reference for the circuit operation and a signal amplifying mode for amplifying the input voltage. The first and second switches 23 and 24 make up a first signal selecting means 38 for selecting a signal to be input to a first capacitive coupling amplifying circuit 36. The first selecting means 38 selects a reference signal voltage Vref during the autozeroed mode period of the first amplifying circuit, and selects the input signal voltage Vin during the signal amplifying mode period. The third and fourth switches 25 and 26 make up a second signal selecting means 39 for selecting a signal to be input to a second capacitive coupling amplifying circuit 37. The second signal selecting means selects the reference signal voltage Vref corresponding to the autozeroed mode period of the second amplifying circuit, and selects the input signal voltage Vin corresponding to the signal amplifying period. The seventh and eighth switches 33 and 34 constitute an output selecting means 40 for selecting the amplified output signal from the first and second amplifying circuits during the signal amplifying mode period. The first and fifth switches 23 and 31 are controlled by the clock signal $\phi_1$ (FIG. 5A). The second switch 24 is controlled by the inverted clock signal $\phi_1$ (FIG. 5B). The third and sixth switches 25 and 32 are controlled by the clock $\phi_2$ (FIG. 5C). The fourth switch 26 is controlled by the inverted clock $\phi_2$ (FIG. 5D). The seventh switch 33 is controlled by the clock $\phi_{12}$ (FIG. 5I).

The operation of the differential voltage amplifier shown in FIG. 4 will be described referring to signal timing charts shown in FIGS. 5A to 5J. Each of these switches is turned on when the control clock signal is "H" in logical level and is turned off when it is "L" in logical level.

When the clock $\phi_1$ (FIG. 5A) is "H" (e.g., duration $t_3$–$t_4$), the first and fifth switches 23 and 31 of the comparator 101 are turned on, and the second switch 24 is turned off. When the first switch 23 is turned on, the reference voltage Vref (FIG. 5E) is selected as the input voltage to the first capacitive coupling amplifier 36. Upon turning on the fifth switch 31, the first capacitive coupling amplifier circuit 36 is set in the autozeroed mode for providing the operating point potential as a reference of the circuit operation. During the "H" level period of the clock $\phi_1$, the threshold voltage $V_{TH}$ as the operation point voltage is set up at the input terminal of the first inverting amplifier 29. The clock $\phi_2$ (FIG. 5C), contains the "H" level period of the clock $\phi_1$, and keeps "L" level during a proper period (e.g., from time $t_1$ to time $t_6$), including the periods preceding and succeeding the "H" level period. During the "L" level of the clock $\phi_2$, the second and third comparators 25 and 32 are turned off, and the fourth switch 26 is turned on. When the fourth switch 26 is turned on, the input signal voltage Vin (FIG. 5E) is selected as the input signal voltage to the second capacitive coupling amplifier circuit 37. When the sixth switch 32 is turned off, the second capacitive coupling amplifier circuit 37 is set in the signal amplifying mode. During the "H" level period of the clock $\phi_2$, i.e., the autozeroed mode period of the second capacitive coupling amplifier circuit 37, the third switches is turned on and the fourth switch 26 is turned off. The reference voltage Vref is input to the second capacitive coupling amplifier circuit 37. During the signal amplifying mode period when the clock $\phi_2$ is "L" level, the second capacitor 28 applies a difference voltage between the reference voltage Vref and the input signal voltage Vin to the second inverting amlifier 30. The second inverting amplifier 30 amplifies this differential voltage. The clock $\phi_{12}$ (FIG. 5H) contains the "H" level period of the clock $\phi_1$ and is at "L" level during a period including the periods (time $t_2$ to time $t_6$) preceding and succeeding the "H" level period. Accordingly, the seventh switch 33 is off and the eighth switch 34 is on, so that the amplified signal $V_{o2}$ (FIG. 5G) output from the second capacitive coupling amplifier circuit 37 is applied as the circuit output Vout (FIG. 5J) to the output terminal 35 of the differential voltage amplifier. It is necessary that the "L" level period of the clock $\phi_2$ be equal to or shorter than the "L" level period of the clock $\phi_2$. In this embodiment, the former is shorter than the latter.

At time $t_4$, when the clock $\phi_1$ is "L", the first and fifth switches 23 and 31 of the chopper type comparator 101 are off and the second switch 24 is ON. Accordingly, the first capacitive coupling amplifier circuit 36 is set in the signal amplifying mode and is supplied with the input signal voltage Vin. As in the previous case, the first inverting amplifier 29 amplifies the difference voltage between the reference voltage Vref and the input signal voltage Vin, and produces an amplified signal $V_{o1}$ (FIG. 5F). For a short while from the start of the signal amplifying period, because of a signal transfer delay or the like caused by the feedthrough of the clock signal through the stray capacitor and the ON resistance of the switches, the output signal of the capacitor 101, i.e., the output signal $V_{o1}$ (FIG. 5F) from the first inverting amplifier 29, varies as indicated by a broken line in FIG. 5F. To avoid the production of this varying output signal $V_{o1}$, the clock $\phi_{12}$ does not go high ("H" level) when the clock $\phi_1$ goes low ("L" level), but goes high following the period T after the clock $\phi_1$ has become "L". This period T is equal to the time period from an instant that the clock $\phi_1$ goes low at least until it settles down to a stable state. Accordingly, until the end of the period $t_1$, the output signal $V_{o1}$ of the first capacitive coupling amplifier circuit 36 is not produced as the output signal $V_{out}$ of the differential voltage amplifier, but the output amplified signal from the second capacitive coupling amplifier circuit 37 is produced continuously. After the end of the period T, at time $t_5$, the output signal $V_{o1}$ from the first capacitive coupling amplifier circuit 36 is produced as the circuit output signal.

At time $t_6$, after at least the period T since time $t_4$, the clock $\phi_2$ goes high and the third and the sixth switches 25 and 32 of the chopper type comparator 102 are turned on, and the fourth switch 26 is turned off. The second capacitive coupling amplifier circuit 37 is set in the autozeroed mode and the reference voltage Vref is selected as the input signal voltage of the second capacitive coupling amplifier circuit 37. The operating point voltage, i.e., the threshold voltage $V_{TH}$, of the second inverting amplifier 30 in the second capacitive coupling amplifier circuit 37 is set in the autozeroed mode. The "L" level period of the clock $\phi_1$ contains the "H" level period of the clock $\phi_2$ (the period from time $t_4$ to $t_9$) and extends to the period preceding and succeeding this "L" level period. During this period, the first capacitive coupling amplifier circuit 36 produces the difference voltage signal $V_{O1}$ between the reference voltage Vref and the input signal voltage Vin. When the clock $\phi_2$ goes low at time $t_7$, the third and sixth switches 25 and 32 in the second comparator 102 are turned off and the fourth switch 26 is turned on. As a result, the second capacitive coupling amplifier circuit 37 is set in the signal amplifying mode and the input signal voltage Vin is selected as the input signal voltage to the second capacitive coupling amplifier circuit 37. Therefore, the second capacitive coupling amplifier circuit 37 produces the difference voltage signal $V_{O2}$ (FIG. 5G). During the transition period in which the clock $\phi_1$ goes low, the transient phenomenon occurs also when the clock $\phi_2$ goes low, so that the amplified output $V_{O2}$ from the second capacitive coupling amplifier circuit 37 is unstable. To avoid the outputting of this unstable signal from the differential voltage amplifier, the clock $\phi_{12}$ goes low at time $t_8$, which is time period T after the clock $\phi_2$ goes low. During the time period T from time $T_7$ to $T_8$, the output signal voltage $V_{O1}$ from the first capacitive coupling amplifier circuit 36 is taken out as the circuit output voltage Vout of the differential voltage amplifier, through the output terminal 35. At time $t_8$, the clock $\phi_{12}$ goes low and then the output signal voltage $V_{O2}$ from the second capacitive coupling amplifier circuit 37 is selected as the output signal voltage Vout and output through the output terminal 35. At time $t_9$ after a period of at least the time period T since time $t_7$, the clock $\phi_1$ goes low and the differential voltage amplifier repeats the above-mentioned operation subsequently.

As seen from the foregoing, the differential voltage amplifier of this embodiment contains the first and second capacitive coupling amplifier circuits 36 and 37. These amplifiers 36 and 37 are alternately set in the autozeroed mode and the signal amplifying mode. The durations of the autozeroed modes of those amplifiers 36 and 37 never overlap each other, while the durations of the signal amplifying modes partially overlap. The circuit output signal is taken out from those amplifies 36 and 37 when they are in the signal amplifying mode. With this arrangement, the results of the comparisons of the reference voltage Vref and the ihput signal voltage Vin can be successively obtained. Accordingly, the need for a frequency limit of the input signal to below ½ the frequency of the clock of the comparator is eliminated. Therefore, the comparison of the high frequency input signal is possible. Further, an instability of the circuit output signal at the transient time due to the transfer delay of the input signal and the like which are caused by the feedthrough of the clock signal through the stray capacitor and the ON resistance of the switches is removed. Therefore, the results of the comparison obtained are highly accurate. Additionally, the main components of the inverting amplifies and the switches are MOS transistors. This implies that the fabrication of this circuit is suitable for an integrated circuit module, and the power dissipation of this circuit is lessened.

Figure 6:
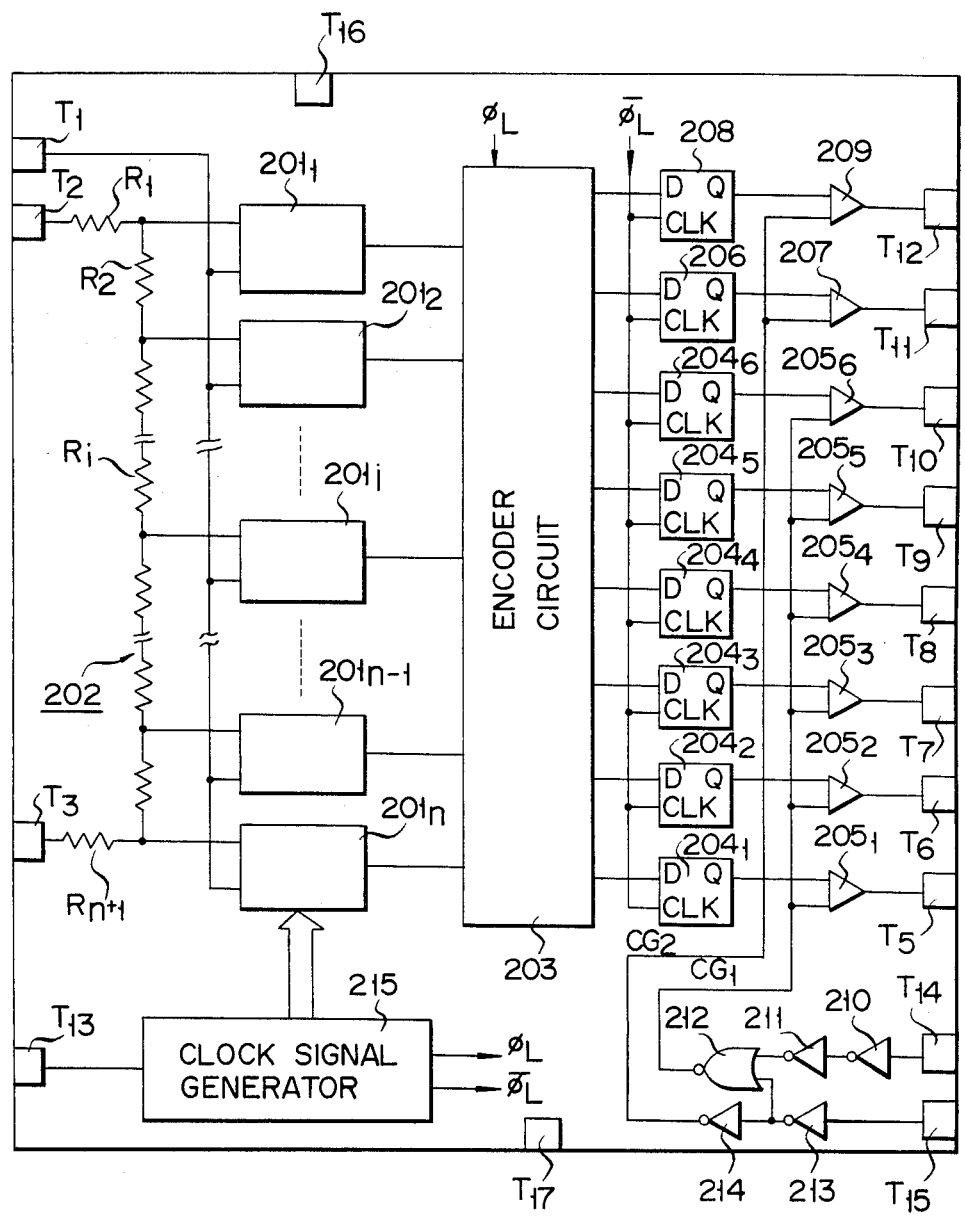
FIG. 6 shows a schematic circuit diagram of an integrated circuit for A/D conversion, which is another embodiment of the present invention and has the amplifying circuit shown in FIG. 4.

FIG. 6 shows a block diagram of an integrated circuit for analog-to-digital conversion using the differential voltage amplifier shown in FIG. 4, which is another embodiment of the present invention. In FIG. 6, reference numerals $201_1$-$201_n$ designate differential voltage amplifiers, as illustrated in block form in FIG. 4. This instance uses 64 differential voltage amplifiers. The input signal voltage Vin is externally applied to the input terminal through a first terminal $T_1$ of the integrated circuit. In this integrated circuit using 64 differential voltage amplifiers $201_1$-$201_n$, a voltage dividing circuit 202 having a series circuit of 65 resistors $R_1$-$R_{65}$ is inserted between a positive reference voltage terminal $T_2$ and a negative reference voltage terminal $T_3$ of the integrated circuit. The interjunctions between the adjacent resistors $R_1$ and $R_2$, $R_2$ and $R_3$, . . . are connected to the first input terminals of the differential voltage amplifiers $201_1$-$201_n$, respectively. The divided voltages at these interjunctions are respectively connected to the corresponding second input terminals of the differential voltage amplifiers $201_1$-$201_n$, so that the divided voltages at the interjunctions are applied as the reference voltages $Vref_1$-$Vref_n$ to the corresponding second input terminals of the differential voltage amplifiers $201_1$, . . . , $201_n$.

The comparing outputs of the differential voltage amplifiers $201_1$-$201_n$ are input to the encoder circuit 203. The encoder circuit 203 encodes the comparing output signal into a 6-bit signal. The encoder circuit 203 has the following compositions, although not shown: a plurality of comparing circuits which are respectively provided for the differential voltage amplifiers $201_1$-$201_n$ and compares the amplified signals with the threshold voltages previously set to convert those amplified signals into a digital signal; a plurality of latch circuits for latching digital signals output from the comparing circuits in response to a latch signal $\phi_L$; an encoder section for converting the digital signals into a binary signal of e.g., 6 bits; an error-detecting circuit for detecting an error; an overflow detecting circuit for detecting an overflow. The 6 bit signals from the encoder circuit 203 are input to latch circuits $204_1$-$204_6$ through their D terminals in response to a latch signal $\phi_L$ and latched in those latch circuits.

The bit signals latched in the latch circuits $204_1$-$204_6$ are output through the Q terminal thereof. The bit signals are transferred to buffers $205_1$-$205_6$ with gate functions, respectively. The bit signals input are taken out from output terminals $T_5$-$T_{10}$ of the integrated circuit in response to a gate signal $CG_1$. When the outputs of all the differential voltage amplifiers $201_1$-$201_n$ are all "H" in level, the overflow detector in the encoder circuit 203 detects such a state to produce an overflow signal. The latch signal $\phi_L$ is input to the CLK terminal of the latch circuit 206. The latch circuit 206 responds to the latch signal $\phi_L$ to fetch an overflow signal through the D terminal and latch it therein. The overflow signal input to the buffer 207 is taken out therefrom to an output terminal $T_{11}$ of the integrated circuit in response to a gate control signal $CG_2$. When the output signals from the differential voltage amplifiers $201_1$-$201_n$ are discontinuously "H" in level, the error detector detects this state to produce an error signal. When the latch signal $\phi_L$ is received at the CLK terminal of the latch circuit 208, the latch circuit 208 responds to this latch signal to fetch the error signal through its D terminal and latch it therein.

The latched error signal is input to a buffer 209 with a gate function. The error signal input to the buffer 209 is sent to an error output terminal $T_{12}$ in response to the gate control signal $CG_2$ input to the buffer 209. A couple of inverters 210 and 211 are connected in series to a first chip enable terminal $T_{14}$. The output terminal of the NOR gate 212 is connected to the first input terminal of a NOR gate 212. A second chip enable terminal $T_{15}$ is also connected to a couple of inverters 213 and 214 in series. The output terminal of the inverter 213 is connected to the second input terminal of the NOR gate 212. The output terminal of the NOR gate 212 is connected to the buffers $205_1$–$205_6$ and applies the output signal therefrom as the gate signal $CG_1$ to those buffers. The inverter 214 is connected at the output terminal to buffers 207 and 209 and applies its output signal as the gate control signal $CG_2$ to those buffers. The integrated circuit is further provided with a block signal generator 215 which frequency-divides a pulse signal externally applied through the clock terminal $T_{13}$ and composes these signals to form clock signals $\phi_1$, $\bar{\phi}_1$, $\phi_2$, $\bar{\phi}_2$, $\phi_{12}$, and $\bar{\phi}_{12}$ and latch signals $\phi_L$ and $\bar{\phi}_L$. Those clock signals are respectively applied to the differential voltage amplifiers $201_1$–$201_n$ to control the timing of their operation. The latch signal $\phi_L$ is input to the encoder circuit 203 to control the timing of its operation. The latch signal $\phi_L$ is input to the CLK terminals of the latch circuits $204_1$–$204_6$, 206 and 208 to control the operation of those latch circuits. The power source terminals $T_{16}$ and $T_{17}$ are impressed with DC power voltages $V_{CC}$ and $V_{SS}$.

Also, this embodiment of FIG. 6, like the embodiment of FIG. 4, continuously compares the reference voltage Vref with the input signal voltage Vin and provides the results of the comparisons. Therefore, this embodiment does not require a frequency limit of the input signal to below ½ the frequency of the clock signal, and hence, can do the comparison on the high frequency input signal. Further, this embodiment does not take out the unstable output at the transient period, which is due to the signal transfer delay resulting from the ON resistance and the leaking of clock signal through the stray capacitance, but takes out only the stable output. This improves the accuracy of the comparison results.

With the use of MOS transistors for the main circuit component of the differential voltage amplifiers and the like, this embodiment is suitable for integrated circuit modules and power dissipation is lessened.

In the embodiment of FIG. 6, when the frequency of the clock signal is set higher than that of the latch signal, that is, when the latch circuits $204_1$–$204_6$ are operated with periods shorter than the signal amplifying mode period, the upper limit of the frequency of the input signal is set higher than the upper limit of the clock signal of the comparator. The reason for this follows. In the parallel A/D converter of this embodiment, the results of the comparison are successively produced and therefore the upper limit of the sampling frequency for the input signal is determined by the operating speed of the latch circuits $204_1$–$204_6$.

Figure 7:
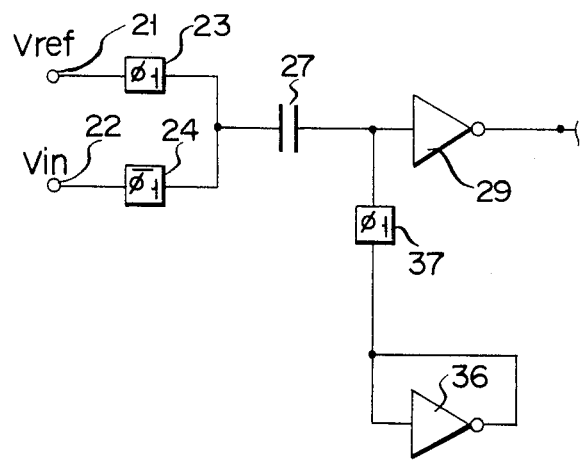
FIGS. 7 to 9 show other circuit arrangements of the differential voltage amplifier shown in FIG. 4.

FIG. 7 shows another arrangement of the chopper type comparator. In this figure, like reference symbols are used to designate like or equivalent portions in FIG. 4. In this instance, the switch 31 for connecting or disconnecting the input and the output of the inverting amplifier 29 to or from each other is omitted. The input terminal of the inverting amplifier 29 is connected through switch 37 to an inverting amplifier 36 having the same characteristic as the inverting amplifier and the input and output are interconnected. The switch 37 is controlled by a control signal $\phi_1$. This arrangement allows the threshold voltage $V_{TH}$ to be applied to the input terminal of the inverting amplifier 29 simultaneously with the turning on of the switch 37. Accordingly, the autozeroed mode period can be shortened. This results in an improvement in the operation speed of the overall circuitry. In this instance, the inverting amplifier 29 may be a noninverting amplifier with the same characteristic.

Figure 8:
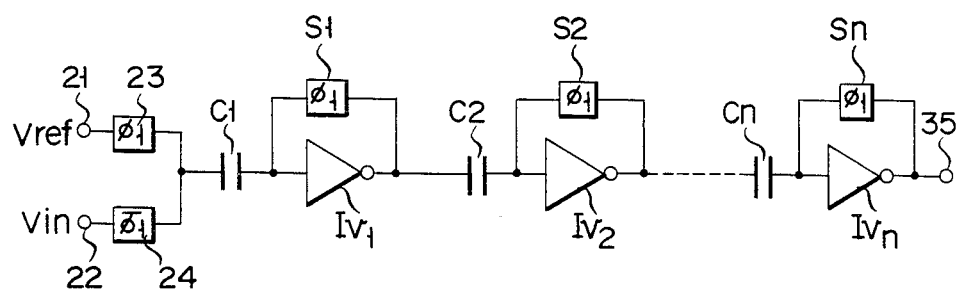

FIG. 8 shows another arrangement of the chopper type comparator 101. The arrangement of FIG. 4 has only one set of the comparator 27, the inverting amplifier 29, and the switch 31. The arrangement of the present embodiment has a plurality of such sets arranged in cascade fashion. In this embodiment, those components corresponding to the capacitor 37, the inverting amplifier 29 and the switch 31 are designated by $C_1$, $Iv_1$ and $S_1$, respectively. As shown, the capacitors $C_1$–$C_n$ and the inverting amplifiers $Iv_1$–$Iv_n$ are alternately arranged in cascade fashion. Switches $S_1$–$S_n$ are respectively connected between the input and the output terminals of the inverting amplifiers $Iv_1$–$Iv_n$. Those switches $S_1$–$S_n$ are turned on in the autozeroed mode in response to the clock signal $\phi_1$. The capacitor $C_1$, the inverting amplifier $Iv_1$ and the switch $S_1$ make up a first stage circuit. Similarly, the capacitor $C_2$, the inverting amplifier $Iv_2$ and the switch $S_2$ make up a second stage circuit. The final stage circuit is made up of the capacitor $C_n$, the inverting amplifier $Iv_n$ and the switch $S_n$. The remaining portion of the circuit is substantially the same as that of the arrangement of FIG. 4.

Figure 9:
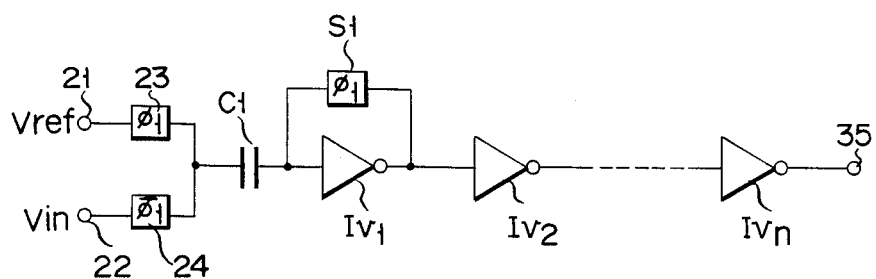

FIG. 9 shows another arrangement of the chopper type comparator 101. This embodiment is a modification of the arrangement of FIG. 8. In this instance, a plurality of inverting amplifiers $Iv_2$–$Iv_n$ with an operating point voltage which is substantially equal to that of the inverting amplifier $Iv_1$.

FIGS. 10 through 13 show practical arrangements of the inverting amplifier assembled into the differential voltage amplifier of FIG. 4 embodiment.

Figure 10:
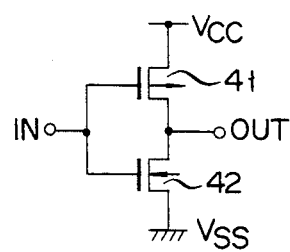
FIGS. 10 to 13 show circuit diagrams of some types of inverting amplifiers assembled into the differential voltage amplifier of FIG. 4.

The arrangement of FIG. 10 features a CMOS (complementary MOS) arrangement containing a P-channel MOS transistor 41 and an N-channel MOS transistor 42. The P-channel MOS transistor 41 is connected at the source to the power voltage $V_{CC}$, and at the drain to the drain of the N-channel MOS transistor 42. The source of the MOS transistor 42 is connected to the ground voltage $V_{SS}$. The gates of these transistors 41 and 42 are interconnected to form an input terminal IN. The interjunction of the drains of the MOS transistors 41 and 42 forms an output terminal OUT.

Figure 11:
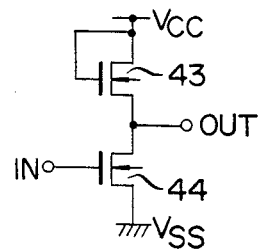

The arrangement of FIG. 11 is composed of two P-channel MOS transistors 43 and 44. The drain of the MOS transistor 43 is connected to the power voltage $V_{CC}$. The gate of the MOS transistor 43 is connected to the drain thereof. The source of the MOS transistor 43 is connected to the drain of the MOS transistor 44. The gate of the MOS transistor 44 serves an input terminal IN of this circuit arrangement, and the source thereof is connected to the ground voltage $V_{SS}$. The interjunction of this MOS transistor provides an output terminal OUT of this circuit arrangement.

Figure 12:
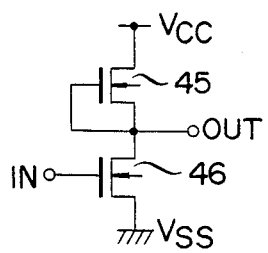

FIG. 12 illustrates an arrangement containing a depletion type MOS transistor 45 and an enhancement type MOS transistor 46, both of the N-channel type. The drain of the MOS transistor 45 is connected to the power voltage $V_{CC}$ and its source is connected to its gate and to the drain of the MOS transistor 46. The gate of the MOS transistor 46 serves as an input terminal IN of this arrangement. The source of the same transistor is connected to the ground voltage $V_{SS}$. The interjunction of the MOS transistors 45 and 46 forms an output terminal OUT of this arrangement.

Figure 13:
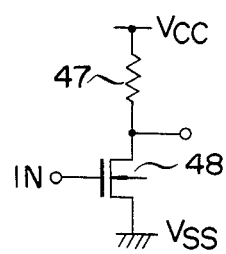

FIG. 13 shows an arrangement of a combination of a linear resistor 47 and an N-channel MOS transistor 48. The MOS transistor 48 is connected at the drain to the power voltage $V_{CC}$ via the linear resistor 47, and at the source to the ground voltage $V_{SS}$. The gate of this transistor forms an input terminal IN and the interjunction of the MOS transistor 48 and the linear resistor 47 provides an output terminal OUT.

In the circuit arrangements of FIGS. 11 to 13, the MOS transistors are all of the N-channel type. It is evident to those skilled in the art that these transistors may all be of the P-channel type instead. In this case, the power voltage $V_{CC}$ and the ground voltage $V_{SS}$ must be interchanged in the connection.

FIGS. 14 to 17 show practical arrangements of the switches in the differential voltage amplifier shown in FIG. 4.

Figure 14:
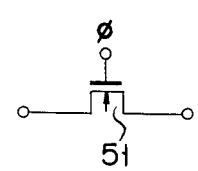
FIGS. 14 through 17 show circuit diagrams of some types of switches each assembled into the differential voltage amplifier of FIG. 4.

The circuit arrangement of FIG. 14 uses an N-channel MOS transistor 51 in which the current path of the MOS transistor 51 is connected to the related parts in the differential voltage amplifier. A control signal $\phi$ is applied to the gate of this transistor. When the control signal $\phi$ is "H", the MOS transistor 51 is turned on.

Figure 15:
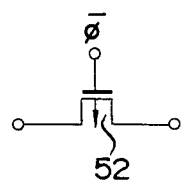

FIG. 15 uses a P-channel MOS transistor 52 whose current path is connected at both ends to the related parts in the circuit. A control signal $\phi$ is applied to the gate of the MOS transistor. When the signal $\phi$ is "L", the MOS transistor 52 is turned on and rendered conductive.

Figure 16:
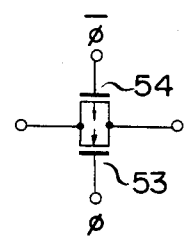

FIG. 16 shows an N-channel MOS transistor 53 and a P-channel MOS transistor 54. The two ends of the current path of the MOS transistor 53 are connected to the two ends of the current path of the MOS transistor 54, respectively. The interjunctions of those MOS transistors are connected to the related parts in the differential voltage amplifier. The gate of the MOS transistor 53 is applied with a clock signal $\phi$. The gate of the MOS transistor 54 is applied with the inverted clock signal $\bar{\phi}$. When the clock signal $\phi$ is "H" (in this case, the clock signal $\bar{\phi}$ is "L"), the MOS transistors are both turned on and conductive.

Figure 17:
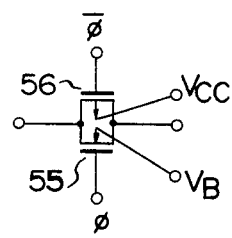

FIG. 17 shows an arrangement composed of an N-channel MOS transistor 55 and a P-channel MOS transistor 56. As in the case of the arrangement of FIG. 16, the first and second current paths of the MOS transistor 55 are respectively connected to the first and second ends of the current path of the MOS transistor 56. A voltage $V_B$ which is intermediate between the power voltage $V_{CC}$ and the ground voltage $V_{SS}$ is applied to the substrate of the N-channel MOS transistor 55. The power voltage $V_{CC}$ is applied to the substrate of the P-channel MOS transistor 56. The gate of the N-channel MOS transistor 55 is applied with a clock signal $\phi$. The gate of the P-channel MOS transistor 56 is applied with the clock signal $\bar{\phi}$. When the clock signal $\phi$ is "H", that is, the clock signal $\bar{\phi}$ is "L", the MOS transistors 55 and 56 are both turned on and conductive.

While specific embodiments of the invention has been described with reference to FIGS. 4 through 17, the present invention is not limited to such embodiments.

In the FIG. 6 embodiment, the pulse signal is externally applied to the clock terminal $T_{13}$ of the integrated circuit and to the clock signal generator 215 formed in the integrated circuit which forms various types of clock pulses. This arrangement, however, may be replaced with an external circuit for generating necessary pulses. Alternately, a crystal oscillator may be formed in the integrated circuit. A crystal resonator is not formed therein but is externally attached to the integrated circuit. When the transient phenomenon of the output signal at the start of the signal amplifying mode is negligible, the start of the signal amplifying mode of the first amplifiers 36 may overlap the stop of the signal amplifying mode of the second amplifier 37. To effect this, the clock signals $\phi_2$ and $\phi_1$, in place of the clock signals $\phi_{12}$ and $\bar{\phi}_{12}$, are applied to the seventh and eighth switches 33 and 34, respectively.

As described above, in the comparator of this invention, the input signal voltage Vin and reference voltages Vref and compared in successive manner. This feature allows this invention to be applicable for the comparison of the input signal at a frequency higher than $\frac{1}{2}$ the frequency of the clock signal. Further, this invention does not take out the unstable output signal at the transient time due to the leak of the clock signal through the stray capacitance and the signal transfer delay caused by the ON resistance, but takes out only the stable output signal after the end of the transient time. This feature provides very accurate comparison results. Further, the main components of the switches in the differential voltage amplifier are MOS transistors. This feature reduces the power dissipation.

Additionally, this invention provides an integrated circuit for A/D conversion with such a differential voltage amplifier, which can effect the comparison of a high frequency input signal with a high accuracy and low power dissipation, and which is suitable for integrated circuit fabrication.

What is claimed is:

1. A differential voltage amplifier comprising:
    first and second capacitive coupling type amplifying means in each of which an autozeroed mode period for setting an operating point and a signal amplifying mode period for amplifying an input voltage are alternately set up, and the autozeroed mode periods in said first and second amplifying means are shifted from each other;
    first and second mode select means for alternately setting up the autozeroed mode and the signal amplifying mode in said first and second capacitive coupling type amplifying means;
    first and second signal selecting means provided corresponding to said first and second capacitive coupling type amplifying means, said first and second signal selecting means alternately selecting a reference voltage and an input signal voltage to apply the selected signal to said first and second capacitive coupling type amplifying means, said first and second signal selecting means selecting the reference voltage corresponding to the autozeroed mode periods of said first and second capacitive coupling type amplifying means and the input signal voltage corresponding to the signal amplifying mode periods; and
    means for selecting the amplified signal output from said first and second capacitive coupling type amplifying means when said first and second capacitive coupling type amplifying means are in the signal amplifying mode.

2. A differential voltage amplifier according to claim 1, wherein said first and second capacitive coupling type amplifying means are each composed of a capacitive element and an inverting amplifier.

3. A differential voltage amplifier according to claim 2, wherein said inverting amplifier is made up of an MOS transistor.

4. A differential voltage amplifier according to claim 1, wherein said mode setting means, said signal selecting means and said output signal selecting means are MOS transistors.

5. An integrated circuit for A/D conversion comprising:
- a plurality of differential voltage amplifiers whose first input terminals are applied with an input signal voltage and those second input terminals are applied with different reference voltages, each of said differential voltage amplifiers including;
- first and second capacitive coupling type amplifying means each of which are alternately set in an autozeroed mode period for setting an operating point and a signal amplifying mode period for amplifying an input voltage, the periods of the autozeroed modes in said first and second amplifying means being shifted from each other;
- first and second mode selecting means for alternately setting up the autozeroed mode and the signal amplifying mode in said first and second capacitive coupling type amplifying means;
- first and second signal selecting means provided corresponding to said first and second capacitive coupling type amplifying means, said first and second signal selecting means alternately selecting a reference voltage and an input signal voltage to apply the selected signal to said first and second capacitive coupling type amplifying means, said first and second signal selecting means selecting the reference voltage corresponding to the autozeroed mode periods of said first and second capacitive coupling type amplifying means and the input signal voltage corresponding to the signal amplifying mode periods; and
- means for selecting the amplified signal output from said first and second capacitive coupling type amplifying means when said first and second capacitive coupling type amplifying means are in the signal amplifying mode.

6. An integrated circuit for A/D conversion according to claim 5, wherein said first and second capacitive coupling type amplifying means are each composed of a capacitive element and an inverting amplifier.

7. An integrated circuit for A/D conversion according to claim 6, wherein said inverting amplifier is made up of a MOS transistor.

8. An integrated circuit for A/D conversion according to claim 5, wherein said mode setting means, said signal selecting means and said output signal selecting means are MOS transistors, respectively.

* * * * *